United States Patent
Li (10) Patent No.: US 8,210,659 B2
(45) Date of Patent: Jul. 3, 2012

(54) LIQUID EJECTING HEAD, LIQUID EJECTING APPARATUS, AND PIEZOELECTRIC ELEMENT

(75) Inventor: Xin-shan Li, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 267 days.

(21) Appl. No.: 12/620,261

(22) Filed: Nov. 17, 2009

(65) Prior Publication Data

US 2010/0141714 A1    Jun. 10, 2010

(30) Foreign Application Priority Data

Dec. 5, 2008   (JP) ................... 2008-311630

(51) Int. Cl.
 *B41J 2/045* (2006.01)
(52) U.S. Cl. ......................................... 347/71
(58) Field of Classification Search ............... 347/68, 347/70–72
See application file for complete search history.

(56) References Cited

U.S. PATENT DOCUMENTS

2004/0051763 A1* 3/2004 Matsubara et al. ............. 347/68

FOREIGN PATENT DOCUMENTS

| JP | 2003-152233 | 5/2003 |
|---|---|---|
| JP | 2004-042287 | 2/2004 |
| JP | 2006-286925 | 10/2006 |
| JP | 2007-042949 | 2/2007 |
| JP | 2007-288123 | 11/2007 |

* cited by examiner

*Primary Examiner* — Matthew Luu
*Assistant Examiner* — Lisa M Solomon
(74) *Attorney, Agent, or Firm* — Workman Nydegger (57) ABSTRACT

A liquid ejecting head includes: pressure generation chambers which communicate with nozzle orifices; and piezoelectric elements which induce pressure change in the pressure generation chambers and each include a first electrode, a piezoelectric body layer formed on the first electrode, and a second electrode formed on the side opposite to the first electrode of the piezoelectric body layer, wherein the piezoelectric body layer includes two dielectric films having the substantially same interstitial distance and an intervening layer provided between the two dielectric films and having a different interstitial distance from that of the dielectric film.

4 Claims, 9 Drawing Sheets

LIQUID EJECTING HEAD, LIQUID EJECTING APPARATUS, AND PIEZOELECTRIC ELEMENT

The entirely disclosure of the Japanese Patent Application No. 2008-311630 filed on Dec. 5, 2008 is expressly incorporated by reference herein.

BACKGROUND

1. Technical Field

The present invention relates to a piezoelectric element including a first electrode, a piezoelectric body layer, and a second electrode, and a liquid ejecting head and a liquid ejecting apparatus, which have the piezoelectric elements.

2. Related Art

As a piezoelectric element used in a liquid ejecting head, there is a piezoelectric element which is constituted by interposing a piezoelectric material having an electromechanical conversion function, for example, a piezoelectric body layer made of a crystallized dielectric material, between two electrodes. The piezoelectric body layer is constituted by, for example, crystallized piezoelectric ceramics. As the piezoelectric ceramics, there is known a composite oxide which has a perovskite type crystal structure and can be expressed by the chemical formula $ABO_3$.

Also, as the piezoelectric element which is mounted in an ink jet type recording head, for example, there is a piezoelectric element which is formed by forming a uniform piezoelectric material layer over the entire surface of a vibration plate by film-formation technology and cutting the piezoelectric material layer into a shape corresponding to a pressure generation chamber by a lithography method so as to be independent for every pressure generation chamber (for example, JP-A-2003-152233, JP-A-2004-42287, JP-A-2006-286925, and JP-A-2007-288123).

However, even if the piezoelectric body layer is composed of columnar crystals, the columnar crystals can obliquely grow, so that there is a possibility that the crystallinity of the piezoelectric body layer is deteriorated, and thus the piezoelectric properties are lowered. Therefore, there is a demand to improve the piezoelectric properties by forming a piezoelectric body layer having more complete columnar crystals.

Further, such a problem similarly exists in the piezoelectric elements mounted in other apparatuses as well as that of the liquid ejecting head typified by the ink jet type recording head.

SUMMARY

An advantage of some aspects of the invention is that it provides a liquid ejecting head, a liquid ejecting apparatus, and a piezoelectric element, which can improve the piezoelectric properties.

According to a first aspect of the invention, there is provided a liquid ejecting head including: pressure generation chambers which communicate with nozzle orifices; and piezoelectric elements which induce pressure change in the pressure generation chambers and each include a first electrode, a piezoelectric body layer formed on the first electrode, and a second electrode formed on the side opposite to the first electrode of the piezoelectric body layer, wherein the piezoelectric body layer includes two dielectric films having the substantially same interstitial distance and an intervening layer provided between the two dielectric films and having a different interstitial distance from that of the dielectric film.

In this aspect, the dielectric film of one electrode side can be formed with more complete columnar crystals on the dielectric film of the other electrode side due to the intervening layer, so that preferential orientation can be performed more completely.

Further, it is preferable that the piezoelectric body layer contain lead, titanium, and zirconium. According to this, the desired piezoelectric properties can be obtained.

Further, according to a second aspect of the invention, there is provided a liquid ejecting apparatus including the liquid ejecting head according to the first aspect. According to this, a liquid ejecting apparatus having improved liquid ejecting characteristics can be realized.

Further, according to a third aspect of the invention, there is provided a piezoelectric element including: a first electrode; a piezoelectric body layer formed on the first electrode; and a second electrode formed on the side opposite to the first electrode of the piezoelectric body layer, wherein the piezoelectric body layer includes two dielectric films having the substantially same interstitial distance and an intervening layer provided between the two dielectric films and having a different interstitial distance from that of the dielectric film.

In this aspect, the dielectric film of one electrode side can be formed with more complete columnar crystals on the dielectric film of the other electrode side due to the intervening layer, so that preferential orientation can be performed more completely.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, the invention will be explained in detail on the basis of embodiments.

Embodiment 1

Figure 1:
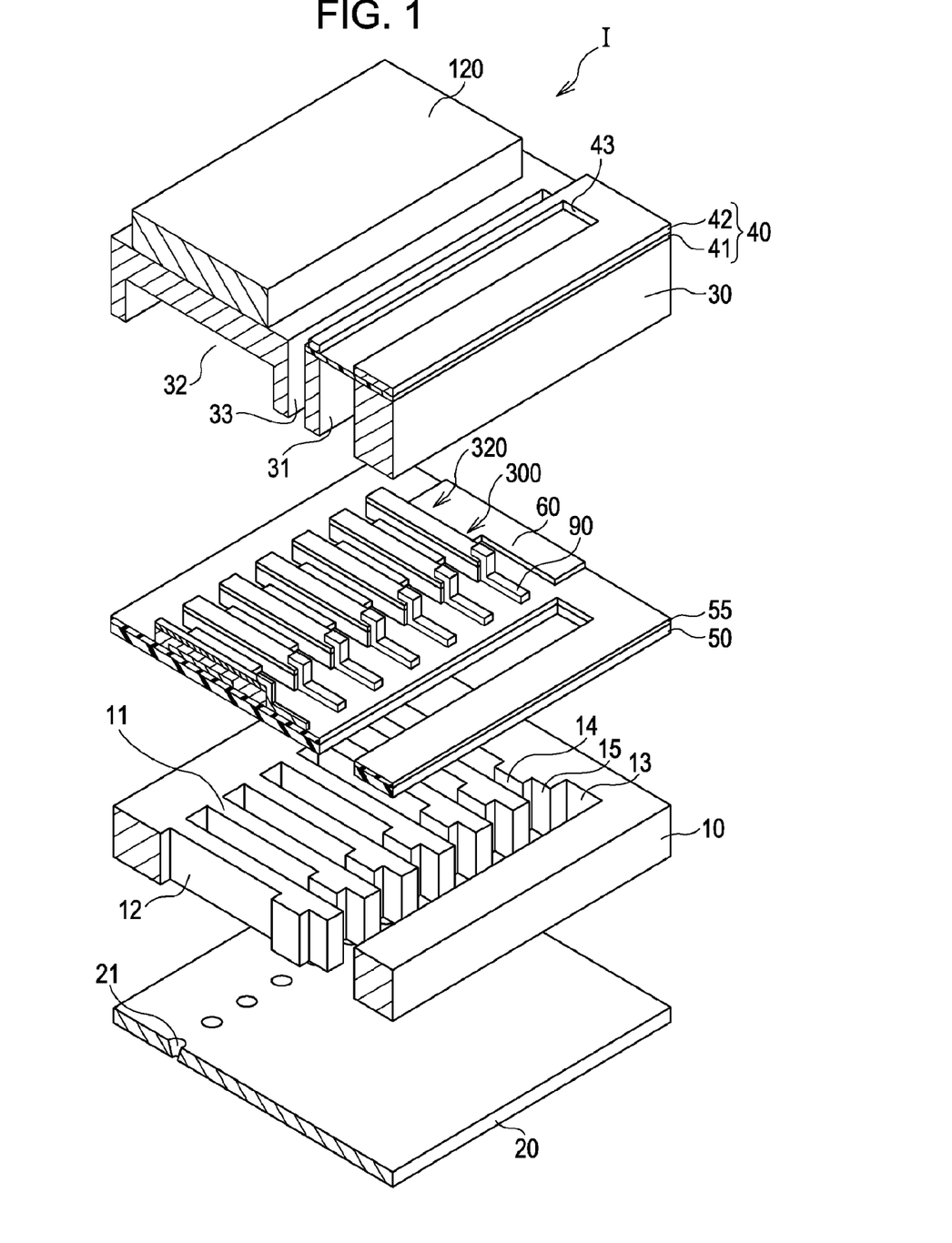
FIG. 1 is an exploded perspective view showing a general configuration of a recording head related to Embodiment 1.
Figure 2A:
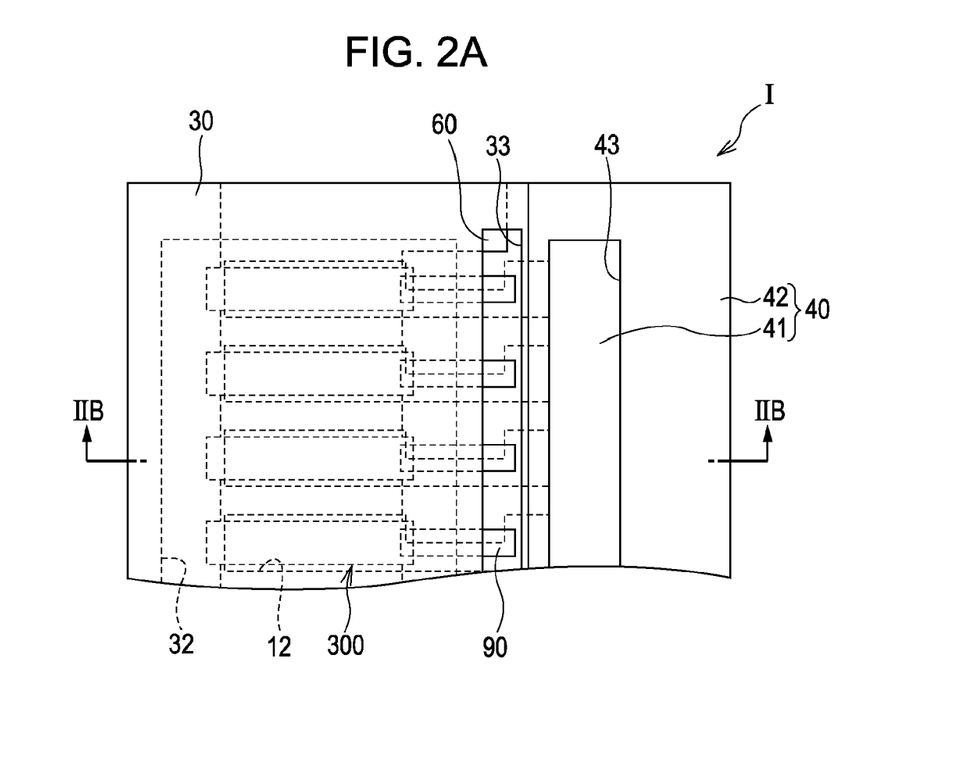
FIGS. 2A and 2B are a plan view and a cross-sectional view of the recording head related to Embodiment 1, respectively.
Figure 2B:
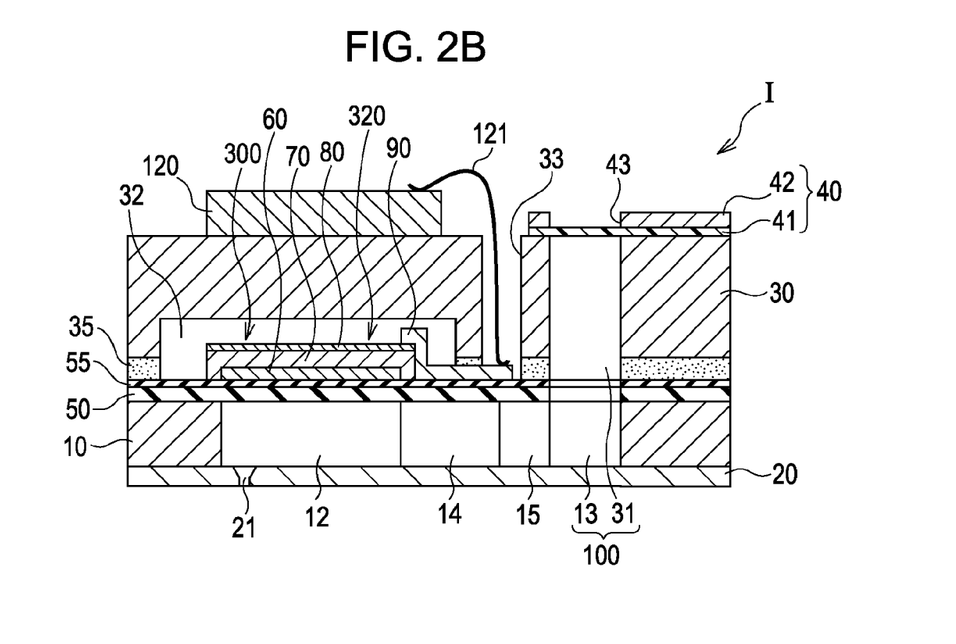
Figure 3:
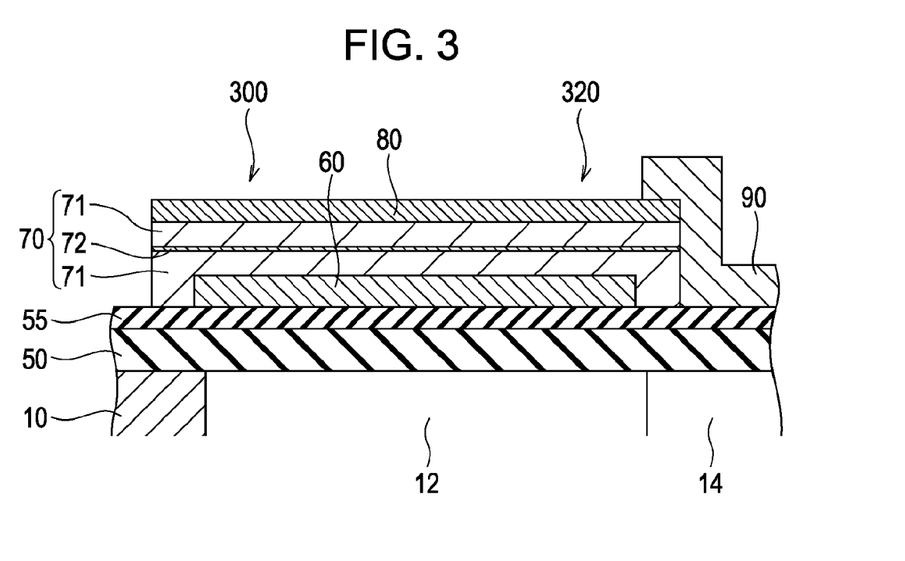
FIG. 3 is a cross-sectional view of a piezoelectric element related to Embodiment 1.
Figure 4A:
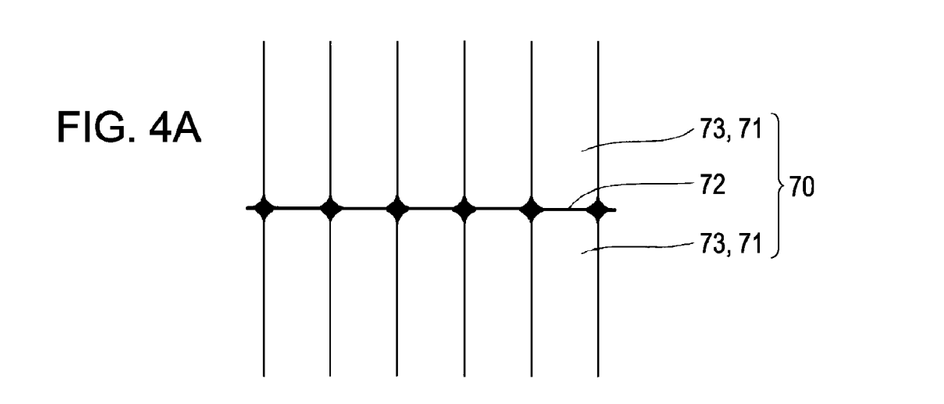
FIGS. 4A and 4B are an enlarged cross-sectional view and a plan view of the main portion of the piezoelectric element related to Embodiment 1, respectively.
Figure 4B:
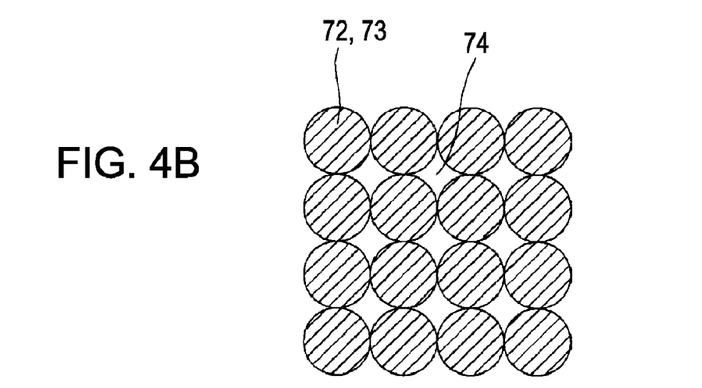

FIG. 1 is an exploded perspective view showing a general configuration of an ink jet type recording head which is one example of a liquid ejecting head related to Embodiment 1 of the invention, FIGS. 2A and 2B are respectively a plan view of FIG. 1 and a cross-sectional view taken along line IIB-IIB of FIG. 2A, FIG. 3 is a cross-sectional view of a piezoelectric element, and FIGS. 4A and 4B are an enlarged cross-sectional view and a plan view of the main portion of FIG. 3, respectively.

As shown in the drawings, a flow path forming substrate 10 is made of a silicon single crystal substrate, and on one side surface thereof, an elastic film 50 made of silicon dioxide is formed.

In the flow path forming substrate 10, a plurality of pressure generation chambers 12 are disposed in parallel in the width direction of the substrate. Further, a communicating portion 13 is formed in a region longitudinally outside the pressure generation chambers 12 of the flow path forming substrate 10, and the communicating portion 13 and each pressure generation chamber 12 communicate with each other through an ink supply path 14 and a communicating path 15, which are provided for every pressure generation chamber 12. The communicating portion 13 communicates with a reservoir portion 31 of a protective substrate described later, thereby constituting a portion of a reservoir which serves as a common ink chamber to the pressure generation chambers 12. The ink supply path 14 is formed into a narrower width than the pressure generation chamber 12 and maintains the constant flow path resistance of ink flowing from the communicating portion 13 into the pressure generation chamber 12. Also, in this embodiment, the ink supply path 14 is formed by narrowing the width of the flow path from one side. However, the ink supply path may also be formed by narrowing the width of the flow path from both sides. Further, the ink supply path may also be formed by narrowing in a thickness direction instead of narrowing the width of the flow path.

Also, in this embodiment, in the flow path forming substrate 10, there is provided a liquid flow path composed of the pressure generation chamber 12, the communicating portion 13, the ink supply path 14, and the communicating path 15.

Further, a nozzle plate 20, in which nozzle orifices 21 each able to communicate with the end portion on opposite side to the ink supply path 14, of each pressure generation chamber 12 are perforated, is fixedly attached on the opening face side of the flow path forming substrate 10 by an adhesive agent, a hot-melt film, or the like. Further, the nozzle plate 20 is made of, for example, glass ceramics, silicon single crystal substrate, stainless steel, or the like.

On the other hand, on the opposite side to the opening face of the flow path forming substrate 10, the elastic film 50 is formed as described above, and on the elastic film 50, an insulator film 55 is formed. Further, a first electrode 60, a piezoelectric body layer 70, and a second electrode 80 are stacked and formed on the insulator film 55, thereby constituting a piezoelectric element 300. Here, the piezoelectric element 300 means a portion including the first electrode 60, the piezoelectric body layer 70, and the second electrode 80. In general, one side electrode of the piezoelectric element 300 is formed as a common electrode, and the other side electrode and the piezoelectric body layer 70 are patterned and constituted for every pressure generation chamber 12. Also, here, a portion which is constituted by the patterned electrode on any one side and the patterned piezoelectric body layer 70 and in which piezoelectric strain occurs due to the application of voltage to both electrodes is referred to as a piezoelectric body active portion 320. Although in this embodiment, the first electrode 60 is set to be the common electrode of the piezoelectric element 300 and the second electrode 80 is set to be the individual electrode of the piezoelectric element 300, they may also be arranged in reverse according to the driving circuit or wiring. Also, here, the piezoelectric element 300 and a vibration plate in which displacement occurs due to the driving of the piezoelectric element 300 are collectively called an actuator device. In addition, although in an example described above, the elastic film 50, the insulator film 55, and the first electrode 60 serve as the vibration plate, the invention is, of course, not to be limited to this configuration, but, for example, a configuration may also be made such that the elastic film 50 and the insulator film 55 are not provided and only the first electrode 60 serves as the vibration plate. Further, a configuration may also be made such that the piezoelectric element 300 itself substantially doubles as the vibration plate.

The piezoelectric body layer 70 is a crystal film having a perovskite type structure and composed of a piezoelectric material of oxide expressed by the general formula $ABO_3$ and having a polarization structure which is formed on the first electrode 60. As for the piezoelectric body layer 70, for example, a ferroelectric material such as lead zirconate titanate (PZT), a material in which metal oxide such as niobium oxide, nickel oxide, or magnesium oxide is added to the ferroelectric material, or the like is suitable. That is, the piezoelectric body layer 70 contains lead, titanium, and zirconium, and specifically, lead zirconate titanate $(Pb(Zr,Ti)O_3)$, lead lanthanium zirconate titanate $((Pb,La)(Zr,Ti)O_3)$, zirconium lead titanate magnesium niobate $(Pb(Zr,Ti)(Mg,Nb)O_3)$, or the like can be used.

As shown in FIG. 3, the piezoelectric body layer 70 includes two dielectric films 71 having the substantially same interstitial distance on the first electrode 60 side and the second electrode 80 side, respectively, and an intervening layer 72 provided between the two dielectric films 71 and having a different interstitial distance from that of the dielectric film 71.

That the interstitial distances of the two dielectric films 71 are the substantially same means that the dielectric films are made of the same material and under the same conditions, and thus are theoretically the same. The two dielectric films 71 are constituted by a plurality of columnar crystals 73 formed so as to extend vertically with respect to the surface (the surface on the piezoelectric body layer 70 side) of the first electrode 60, as shown in FIGS. 4A and 4B. The columnar crystals 73 constituting each of the two dielectric films 71 are disposed such that the positions in a plane (the surface of the first electrode 60) are the substantially same. That is, the dielectric film 71 on one electrode side is formed by epitaxial growth with the intervening layer 72 interposed between it and the dielectric film 71 on the other electrode side, and in the two dielectric films 71, the positions of the crystal grains of crystal faces are the substantially same.

The intervening layer 72 is provided on the dielectric film 71 on one electrode side in order to epitaxial-grow the dielectric film 71 on the other electrode side. This intervening layer 72 has the substantially same composition and crystal structure as those of the dielectric film 71, but the interstitial distance of a crystal, namely, the lengths of crystal axes (expressed by a, b, and c of a lattice constant) are different from those of the dielectric film 71. This intervening layer 72 is provided such that it exists between two columnar crystals 73 in the lamination direction of the two dielectric films 71, namely, between the columnar crystals 73 in a thickness direction toward the second electrode 80 from the first electrode 60, as shown in FIG. 4A. Here, as shown in FIG. 4B, in a space 74 between adjacent columnar crystals 73 in a plane (the surface on the piezoelectric body layer 70 side of the first electrode 60), foreign matter (non-crystal), an air gap, or the like exists, and the intervening layer 72 does not exist. That is, the intervening layers 72 are scattered between the two dielectric films 71.

As for the composition ratio of such a piezoelectric body layer 70, Pb/(Zr+Ti)=1.05 to 1.5 and Zr/Ti=53/47 to 75/25 are suitable.

Further, in the piezoelectric body layer 70, the crystal is preferentially oriented to a (100) plane. In this embodiment, by providing the intervening layer 72, the columnar crystals 73 of the dielectric film 71 of one side can be vertically set up on the dielectric film 71 of the other side. Therefore, most (for example, 99% or more) of the piezoelectric body layer 70 can be preferentially oriented to the (100) plane, namely, this can be done more completely. Also, this enables further increase in XRD strength.

With respect to the thickness of the piezoelectric body layer 70, the thickness is suppressed to such an extent that a crack does not occur in the manufacturing process, and is thickly formed to such an extent as to manifest a sufficient displacement characteristic. For example, in this embodiment, the piezoelectric body layer 70 was formed with a thickness of the order of 1 to 5 μm.

Further, to each second electrode 80 which is the individual electrode of the piezoelectric element 300, a lead electrode 90 made of, for example, gold (Au) or the like is connected, and the lead electrode 90 is drawn out from the proximity of the end of the ink supply path 14 side and extends onto the insulator film 55.

The protective substrate 30 having the reservoir portion 31 which constitutes at least a portion of a reservoir 100 is joined via an adhesive agent 35 on the flow path forming substrate 10 on which such a piezoelectric element 300 was formed, namely, on the first electrode 60, the elastic film 50, and the lead electrode 90. In this embodiment, the reservoir portion 31 is formed to penetrate the protective substrate 30 in a thickness direction and extend in the width direction of the pressure generation chamber 12, and communicates with the communicating portion 13 of the flow path forming substrate 10 as described above, thereby constituting the reservoir 100 which serves as a common ink chamber to the pressure generation chambers 12.

Further, in the region facing the piezoelectric element 300, of the protective substrate 30, a piezoelectric element retention portion 32 having space to an extent that does not obstruct the movement of the piezoelectric element 300 is provided. The piezoelectric element retention portion 32 should just have space to an extent that does not obstruct the movement of the piezoelectric element 300, and the space can be sealed, but does not need to be sealed.

As for such a protective substrate 30, it is preferable to use a material having approximately the substantially same coefficient of thermal expansion as that of the flow path forming substrate 10, for example, glass, ceramic material, or the like, and in this embodiment, the protective substrate 30 was formed using a silicon single crystal substrate which is the same material as that of the flow path forming substrate 10.

Also, a through-hole 33 which penetrates the protective substrate 30 in a thickness direction is provided in the protective substrate 30. Further, the end portion of the lead electrode 90 drawn out from each piezoelectric element 300 is provided to be exposed in the through-hole 33.

Also, a driving circuit 120 for driving the piezoelectric elements 300 disposed in parallel is fixed on the protective substrate 30. As for the driving circuit 120, for example, a circuit substrate, a semiconductor integrated circuit (IC), or the like can be used. Further, the driving circuit 120 and the lead electrodes 90 are electrically connected to each other through connection wirings 121 which are made of a conductive wire such as a bonding wire.

Also, on such a protective substrate 30, a compliance substrate 40 constituted by a sealing film 41 and a fixing plate 42 is joined. Here, the sealing film 41 is made of a material (for example, polyphenylene sulfide (PPS) film of a thickness of 6 μm) having flexibility and low rigidity, and one side face of the reservoir portion 31 is sealed by the sealing film 41. Also, the fixing plate 42 is formed of a hard material such as metal (for example, stainless steel (SUS) or the like of a thickness of 30 μm). Since the region facing the reservoir 100 of the fixing plate 42 is formed as an opening portion 43 in which the fixing plate was completely removed in the thickness direction, one side face of the reservoir 100 is sealed only by the sealing film 41 having flexibility.

In the ink jet type recording head of this embodiment, ink is introduced from an ink introduction port connected to an external ink supply means (not shown), and the inside extending from the reservoir 100 to the nozzle orifice 21 is filled with ink. Thereafter, according to a recording signal from the driving circuit 120, voltage is applied between the first electrodes 60 and the second electrode 80 corresponding to the pressure generation chamber 12, so that the elastic film 50, the insulator film 55, the first electrode 60, and the piezoelectric body layer 70 are flexed and deformed, whereby the pressure in each pressure generation chamber 12 increases, and consequently an ink droplet is discharged out of the nozzle orifice 21.

In this embodiment, since the piezoelectric body layer 70 can be preferentially oriented to the (100) plane more completely, the piezoelectric properties of the piezoelectric body layer 70 can be improved. That is, by using the piezoelectric body layer 70 having the improved piezoelectric properties in the ink jet type recording head I, the ink discharging characteristic can be improved.

Hereinafter, the manufacturing method of such an ink jet type recording head will be explained with reference to FIGS. 5A to 9. Further, FIGS. 5A to 9 are cross-sectional views showing the manufacturing method of the ink jet type recording head related to the embodiment of the invention, and in particular, FIGS. 6A and 6B are enlarged cross-sectional views of the main portion.

Figure 5A:
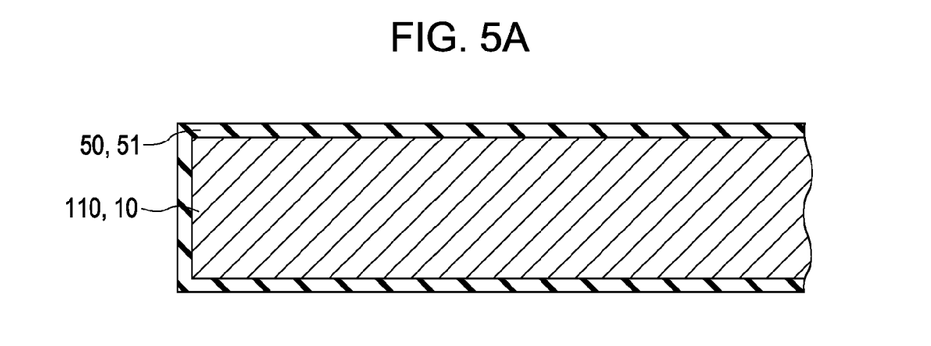
FIGS. 5A to 5C are cross-sectional views showing the manufacturing method of the recording head related to Embodiment 1.
Figure 6A:
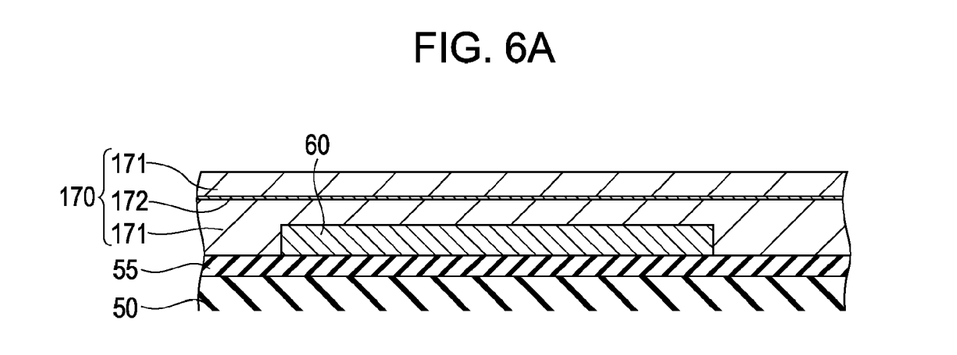
FIGS. 6A and 6B are enlarged cross-sectional views of the main portion, showing the manufacturing method of the recording head related to Embodiment 1.
Figure 6B:
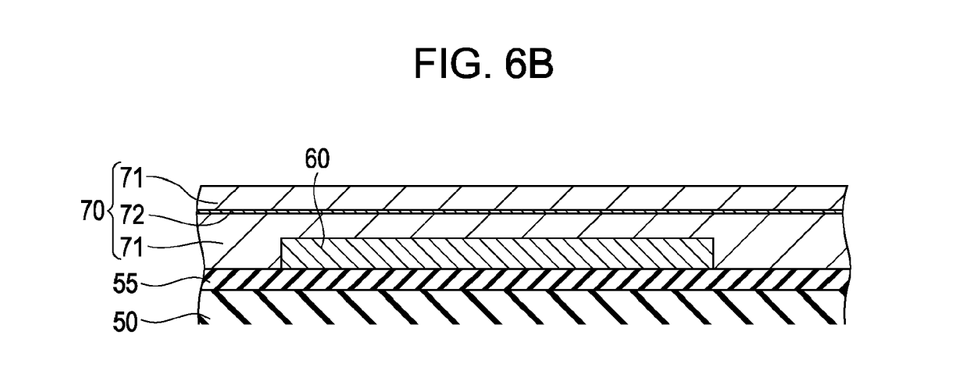

First, as shown in FIG. 5A, an oxide film 51 constituting the elastic film 50 is formed on the surface of a wafer 110 for a flow path forming substrate, which is a silicon wafer and in which a plurality of the flow path forming substrates 10 are integrally formed. In this embodiment, the oxide film 51 made of silicon dioxide was formed by thermally oxidizing the wafer 110 for a flow path forming substrate.

Figure 5B:
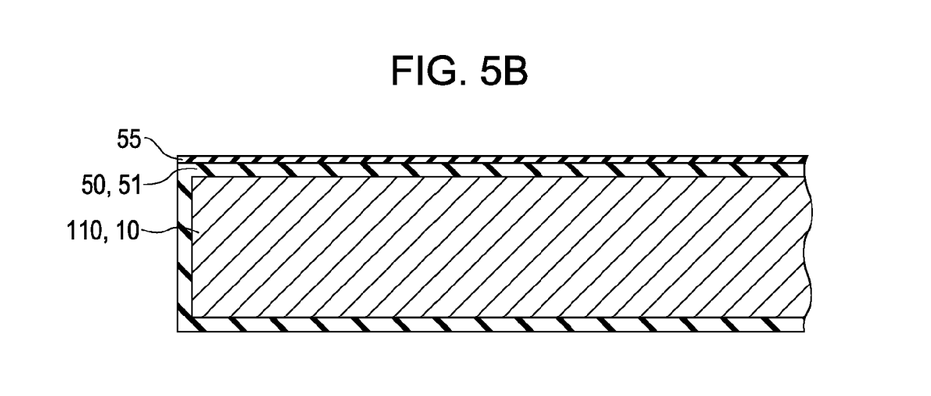

Next, as shown in FIG. 5B, the insulator film 55 made of zirconium oxide is formed on the elastic film 50 (oxide film 51).

Figure 5C:
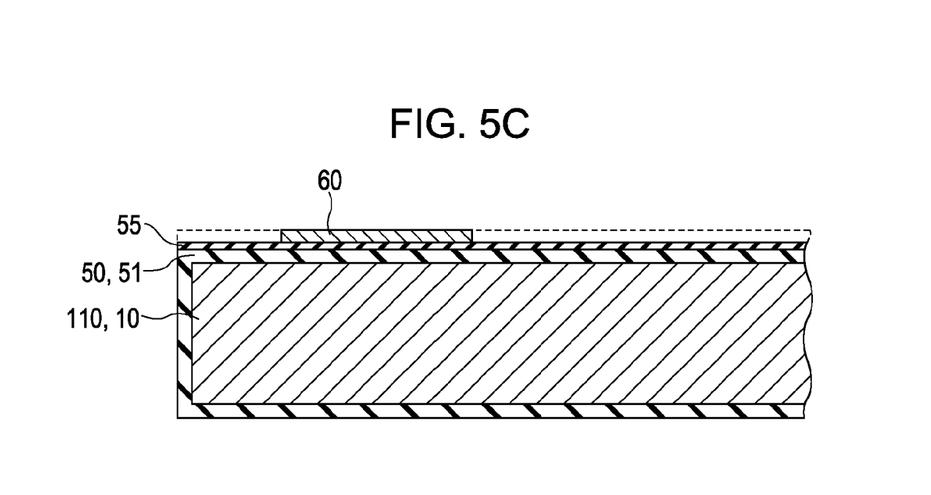

Next, as shown in FIG. 5C, the first electrode 60 is formed on the entire surface of the insulator film 55 and patterned into a given shape. As for the material of the first electrode 60, although not particularly limited, in a case where lead zirconate titanate (PZT) is used as the piezoelectric body layer 70, a material in which change in conductivity due to the diffusion of lead oxide is small is preferable. Therefore, as the material of the first electrode 60, platinum, iridium, or the like may be suitably used. Also, the first electrode 60 can be formed by, for example, a sputtering method, a PVD method (physical vapor deposition method), or the like. Also, although not particularly shown in the drawing, in order to excellently form the piezoelectric body layer 70 of columnar crystals on the first electrode 60, a material serving as a crystal species, such as titanium, may also be disposed on the piezoelectric body layer 70 side of the first electrode 60.

Next, the piezoelectric body layer 70 made of, for example, lead zirconate titanate (PZT) or the like is formed on the first electrode 60 side of the wafer 110 for a flow path forming substrate.

As for the manufacturing method of the piezoelectric body layer 70, the piezoelectric body layer can be formed, for example, by forming a piezoelectric body precursor layer before crystallization by a sputtering method or a chemical vapor deposition method (CVD method), and then firing the piezoelectric body precursor layer.

Specifically, first, as shown in FIG. 6A, a piezoelectric body precursor layer 170 which will become the piezoelectric body layer 70 is formed. The piezoelectric body precursor layer 170 of this embodiment includes two dielectric precursor films 171 which will become the dielectric films 71, and an intervening precursor layer 172 which is provided between the two dielectric precursor films 171 and will become the intervening layer 72. Such a piezoelectric body precursor layer 170 can be formed by stopping film-formation once during the continuous film-formation of the dielectric precursor film 171 on the first electrode 60 side of the wafer 110 for a flow path forming substrate by a sputtering method or a CVD method. That is, the dielectric precursor film 171 of the first electrode 60 side is formed by the first continuous film-formation, and the intervening precursor layer 172 can be formed by temporarily stopping the film-formation. Then, the dielectric precursor film 171 on the opposite side to the first electrode 60 (on the second electrode 80 (not shown) side) can be formed on the intervening precursor layer 172 by restarting the second continuous film-formation. In short, it is possible to form two dielectric precursor films 171 by continuous film-formation and form the intervening precursor layer 172 by temporarily stopping the film-formation.

Further, in the film-formation using a method such as a sputtering method or a CVD method which forms the piezoelectric body precursor layer 170, a deposition temperature is preferably 500° C. or less.

Next, as shown in FIG. 6B, by firing and crystallizing the piezoelectric body precursor layer 170, the piezoelectric body layer 70 is formed. The firing temperature of the piezoelectric body precursor layer 170 is preferably 700° C. to 900° C. If the piezoelectric body precursor layer 170 is heated in this way, the first electrode 60 is substantially heated, so that the piezoelectric body layer 70 is crystallized while epitaxial-growing from the first electrode 60 side. At this time, the dielectric precursor film 171 above the intervening precursor layer 172 (on the opposite side to the first electrode 60) can epitaxial-grow following the crystal structure of the intervening layer 72 due to the intervening precursor layer 172, so that the columnar crystals 73 (refers to FIGS. 4A and 4B) of the dielectric film 71 above the intervening layer 72 can be vertically formed.

Therefore, most (for example, 99% or more) of the piezoelectric body layer 70 can be preferentially oriented to the (100) plane, namely, this can be done more completely.

Further, the forming method of the piezoelectric body layer 70 is not particularly limited, but, for example, a sol-gel method, a MOD (Metal-Organic Decomposition) method, or the like may also be used.

Figure 7A:
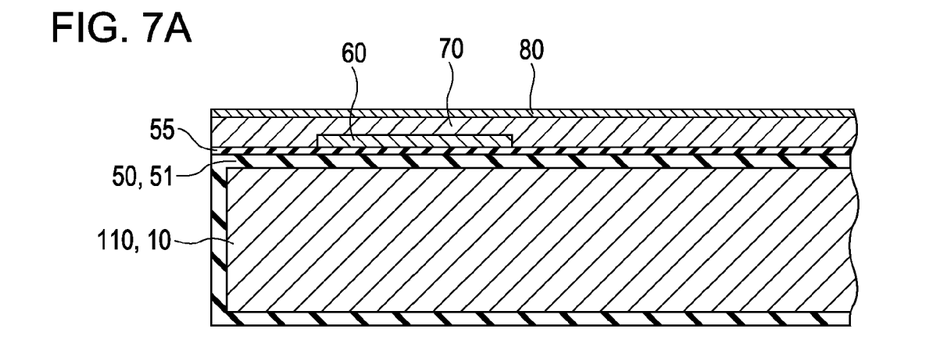
FIGS. 7A to 7C are cross-sectional views showing the manufacturing method of the recording head related to Embodiment 1.

Next, as shown in FIG. 7A, the second electrode 80 made of, for example, iridium is formed on the piezoelectric body layer 70.

Figure 7B:
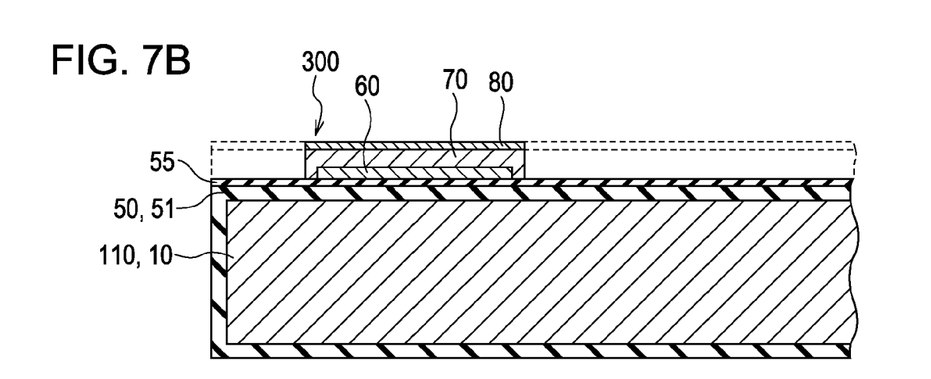

Next, as shown in FIG. 7B, by simultaneously etching the second electrode 80 and the piezoelectric body layer 70, the piezoelectric element 300 is formed in the region corresponding to each pressure generation chamber 12. Here, as an example of the etching of the second electrode 80 and the piezoelectric body layer 70, dry etching such as reactive ion etching or ion milling can be performed.

Figure 7C:
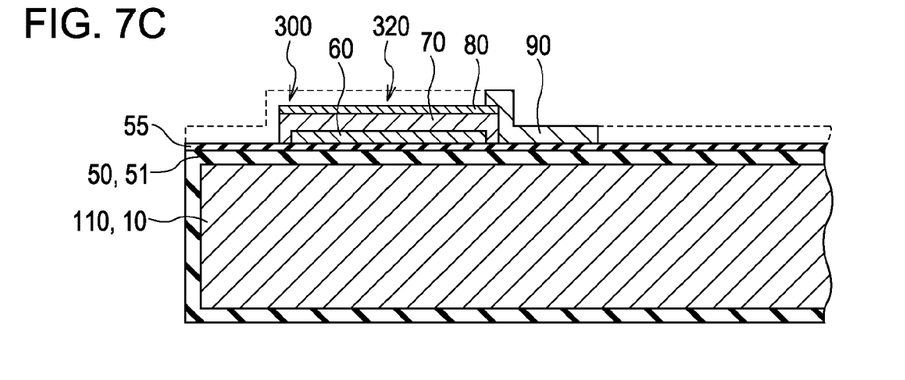

Next, as shown in FIG. 7C, the lead electrode 90 made of gold (Au) is formed over the entire surface of the wafer 110 for a flow path forming substrate, and then patterned for each piezoelectric element 300.

Figure 8A:
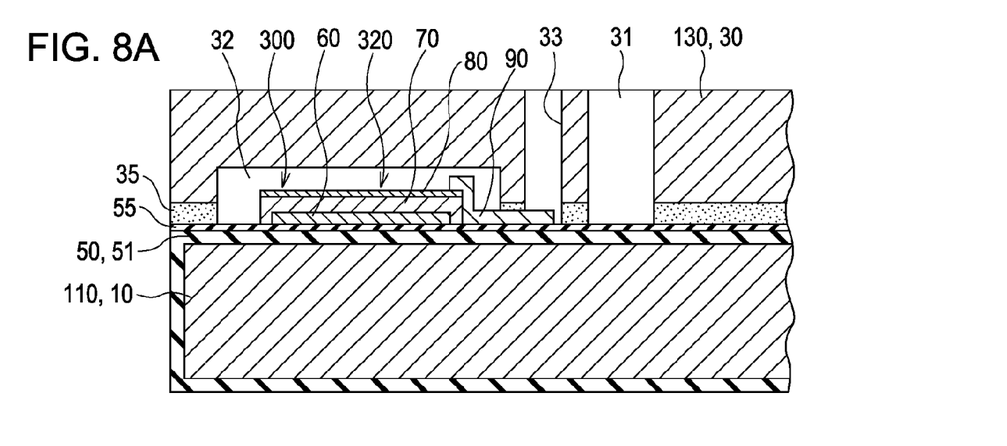
FIGS. 8A to 8C are cross-sectional views showing the manufacturing method of the recording head related to Embodiment 1.

Next, as shown in FIG. 8A, a wafer 130 for a protective substrate is joined on the wafer 110 for a flow path forming substrate via the adhesive agent 35. Here, the wafer 130 for a protective substrate is a substrate in which a plurality of protective substrates 30 are integrally formed, and in the wafer 130 for a protective substrate, the reservoir portions 31, the piezoelectric element retention portions 32, and the like have been formed in advance. The rigidity of the wafer 110 for a flow path forming substrate is remarkably improved by joining it to the wafer 130 for a protective substrate.

Figure 8B:
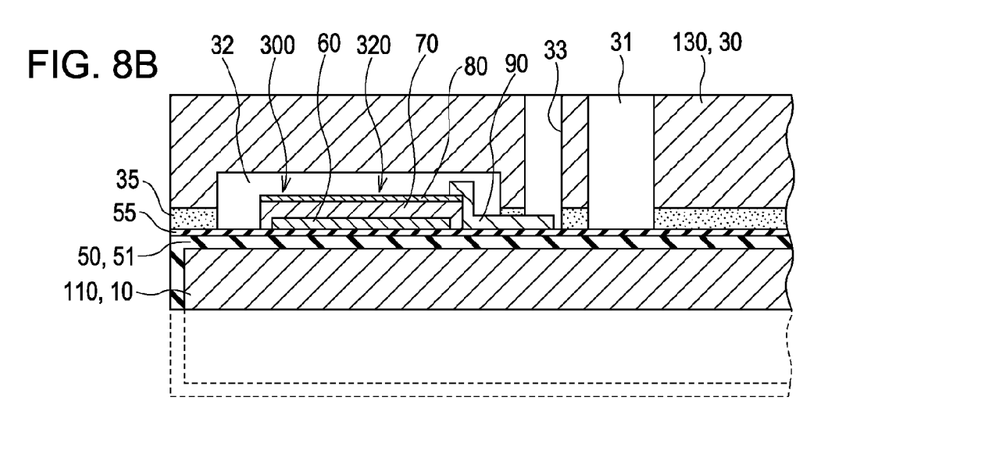

Next, as shown in FIG. 8B, the wafer 110 for a flow path forming substrate is thinned to a given thickness.

Figure 8C:
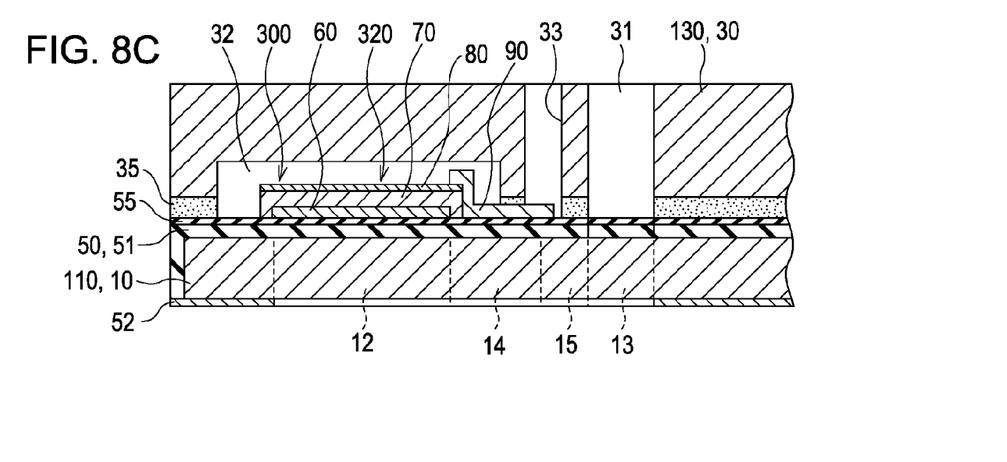
Figure 9:
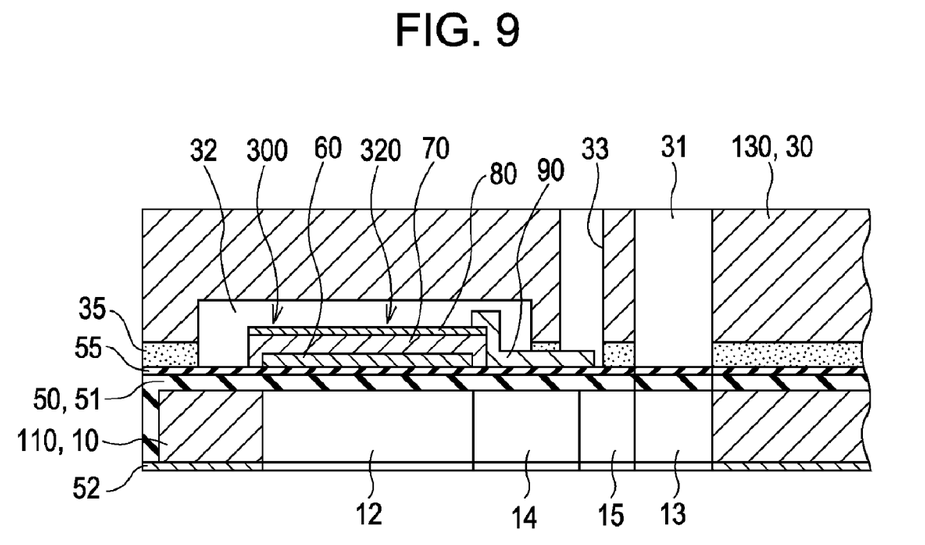
FIG. 9 is a cross-sectional view showing the manufacturing method of the recording head related to Embodiment 1.

Next, as shown in FIG. 8C, a mask 52 is newly formed on the wafer 110 for a flow path forming substrate and patterned into a given shape. Then, as shown in FIG. 9, by carrying out anisotropic etching (wet etching) using an alkali solution such as KOH on the wafer 110 for a flow path forming substrate through the mask 52, the pressure generation chamber 12, the communicating portion 13, the ink supply path 14, the communicating path 15, and the like, which correspond to the piezoelectric element 300, are formed.

After that, the mask 52 on the surface of the wafer 110 for a flow path forming substrate is removed, and the unnecessary portions of the periphery portions of the wafer 110 for a flow path forming substrate and the wafer 130 for a protective substrate are cut and removed by, for example, dicing or the like. Then, the nozzle plate 20 in which the nozzle orifices 21 are perforated is joined to the face on the opposite side to the wafer 130 for a protective substrate, of the wafer 110 for a flow path forming substrate, the compliance substrate 40 is joined to the wafer 130 for a protective substrate, and the wafer 110 for a flow path forming substrate is divided into the respective flow path forming substrates 10 of one chip size as shown in FIG. 1, whereby the ink jet type recording head of this embodiment is completed.

Other Embodiments

Although one embodiment of the invention has been described above, the basic configuration of the invention is not to be limited to that described above. In Embodiment 1 described above, a configuration was illustrated in which the piezoelectric body layer 70 is constituted by two dielectric films 71 and the intervening layer 72 provided between the two dielectric films 71. However, the number of the dielectric films 71 and the number of the intervening layer 72 are not particularly limited to these. The intervening layer 72 may also be provided in plural layers of 2 layers or more. Basically, if two dielectric films 71 are disposed so as to interpose the intervening layer 72 therebetween, similar effects to Embodiment 1 described above can be obtained. Incidentally, a plurality of intervening layers 72 can be formed by increasing the number of times of temporarily stopping the film-formation of the dielectric precursor film 171 by a sputtering method or a CVD method, similarly to Embodiment 1 described above. That is, the intervening layer 72 can be formed every time the film-formation of the dielectric precursor film 171 is temporarily stopped.

Also, although in Embodiment 1 described above, the silicon single crystal substrate was given as an example of the flow path forming substrate 10, the flow path forming substrate is not particularly limited to this, but a material such as an SOI substrate or glass may also be used.

Further, although in Embodiment 1 described above, the piezoelectric element 300 in which the first electrode 60, the piezoelectric body layer 70, and the second electrode 80 are stacked in sequence on the substrate (flow path forming substrate 10) was illustrated, the invention is not particularly limited to this, but can also be applied to, for example, a longitudinal vibration type piezoelectric element which is elongated and contracted in an axial direction by alternately stacking a piezoelectric material and a electrode forming material.

Figure 10:
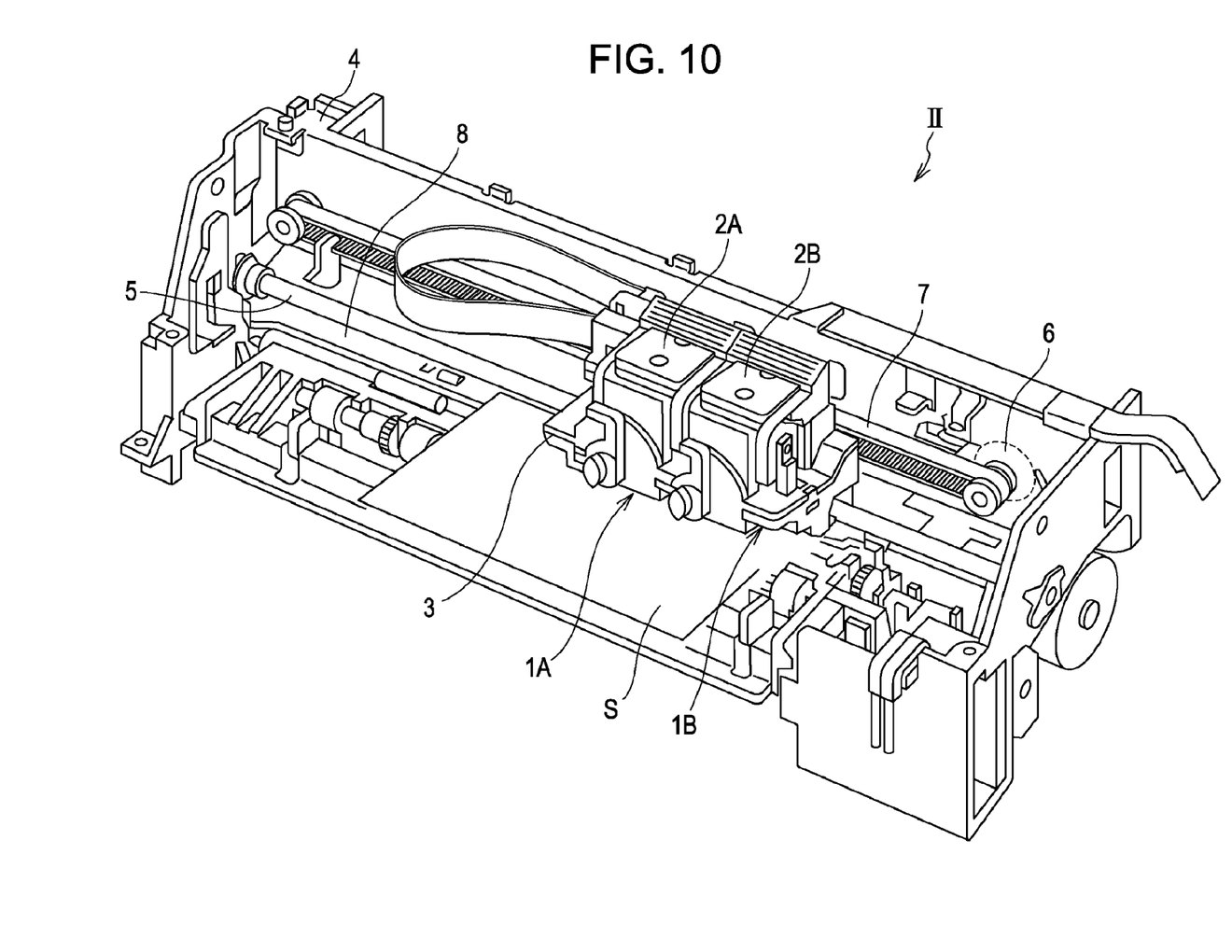
FIG. 10 is a view showing a general configuration of a recording apparatus related to one embodiment of the invention.

Further, the ink jet type recording head I of these embodiments constitutes a portion of a recording head unit having an ink flow path which communicates with an ink cartridge and the like, and is mounted in an ink jet type recording apparatus. FIG. 10 is a schematic view showing one example of the ink jet type recording apparatus.

In the ink jet type recording apparatus II shown in FIG. 10, cartridges 2A and 2B constituting an ink supply means are detachably mounted on the recording head units 1A and 1B having the ink jet type recording heads I, and a carriage 3 on which the recording head units 1A and 1B are mounted is provided to be movable in an axial direction on a carriage shaft 5 attached to an apparatus main body 4. The recording head units 1A and 1B discharge, for example, a black ink composition and a color ink composition, respectively.

Further, the carriage 3 on which the recording head units 1A and 1B are mounted is moved along the carriage shaft 5 by the driving force of s drive motor 6, which is transmitted to the carriage 3 through a plurality of gears (not shown) and a timing belt 7. On the other hand, a platen 8 is provided along the carriage shaft 5 in the apparatus main body 4, and a recording sheet S which is a recording medium such as paper and is fed by a paper feed roller (not shown) or the like is wound around the platen 8 and transported.

Also, although in Embodiment 1 described above, the ink jet type recording head was taken and described as an example of the liquid ejecting head, the invention broadly targets liquid ejecting heads in general and, of course, is also applicable to liquid ejecting heads which eject liquid other than ink. As other liquid ejecting heads, for example, various recording heads used in an image recording apparatus such as a printer, a color material ejecting head used for the manufacturing of a color filter of a liquid crystal display or the like, an electrode material ejecting head used for the formation of the electrode of an organic EL (electroluminescence) display, a FED (Field Emission Display), or the like, a biological organic matter ejecting head used for the manufacturing of a bio-chip, and the like can be given.

Further, the invention is not limited to the piezoelectric element which is mounted in the liquid ejecting head typified by the ink jet type recording head, but can also be applied to the piezoelectric element which is mounted in other apparatuses.

What is claimed is:

1. A liquid ejecting head comprising:
   pressure generation chambers which communicate with nozzle orifices; and
   piezoelectric elements which induce pressure change in the pressure generation chambers and each include a first electrode, a piezoelectric body layer formed on the first electrode, and a second electrode formed on the side opposite to the first electrode of the piezoelectric body layer,
   wherein the piezoelectric body layer includes two dielectric films having the substantially same interstitial distance and an intervening layer provided between the two dielectric films and having a different interstitial distance from that of the dielectric film, wherein the intervening layer has substantially the same composition as the two dielectric films.

2. The liquid ejecting head according to claim 1, wherein the piezoelectric body layer contains lead, titanium, and zirconium.

3. A liquid ejecting apparatus comprising the liquid ejecting head according to claim 1.

4. A piezoelectric element comprising:
   a first electrode;
   a piezoelectric body layer formed on the first electrode; and
   a second electrode formed on the side opposite to the first electrode of the piezoelectric body layer,
   wherein the piezoelectric body layer includes two dielectric films having the substantially same interstitial distance and an intervening layer provided between the two dielectric films and having a different interstitial distance from that of the dielectric film, wherein the intervening layer has substantially the same composition as the two dielectric films.

\* \* \* \* \*